(12) United States Patent
Standing

(10) Patent No.: US 9,147,644 B2
(45) Date of Patent: Sep. 29, 2015

(54) SEMICONDUCTOR DEVICE AND PASSIVE COMPONENT INTEGRATION IN A SEMICONDUCTOR PACKAGE

(75) Inventor: Martin Standing, Tonbridge (GB)

(73) Assignee: International Rectifier Corporation, El Segundo, CA (US)

( * ) Notice: Subject to any disclaimer, the term of this patent is extended or adjusted under 35 U.S.C. 154(b) by 257 days.

(21) Appl. No.: 12/455,738

(22) Filed: Jun. 5, 2009
(Under 37 CFR 1.47)

(65) Prior Publication Data

US 2010/0102327 A1    Apr. 29, 2010

Related U.S. Application Data

(63) Continuation-in-part of application No. 12/037,557, filed on Feb. 26, 2008.

(60) Provisional application No. 61/131,690, filed on Jun. 11, 2008.

(51) Int. Cl.

| | | |
|---|---|---|
| *H01L 21/02* | (2006.01) | |
| *H01L 23/492* | (2006.01) | |
| *H01L 23/498* | (2006.01) | |
| *H01L 25/07* | (2006.01) | |
| *H01L 25/11* | (2006.01) | |
| *H01L 25/16* | (2006.01) | |
| *H01L 23/50* | (2006.01) | |
| *H01L 23/00* | (2006.01) | |

(52) U.S. Cl.
CPC ........ *H01L 23/492* (2013.01); *H01L 23/49833* (2013.01); *H01L 23/49844* (2013.01); *H01L 25/072* (2013.01); *H01L 25/115* (2013.01); *H01L 25/16* (2013.01); *H01L 23/50* (2013.01); *H01L 24/16* (2013.01); *H01L 24/31* (2013.01); *H01L 2224/16225* (2013.01); *H01L 2224/32225* (2013.01); *H01L 2224/33181* (2013.01); *H01L 2924/1305* (2013.01); *H01L 2924/13055* (2013.01); *H01L 2924/13091* (2013.01); *H01L 2924/14* (2013.01); *H01L 2924/15311* (2013.01); *H01L 2924/19105* (2013.01)

(58) Field of Classification Search
CPC ................... H01L 21/02458; H01L 21/02454; H01L 33/007; H01L 33/32
USPC .................... 257/76, 213, 528, 723, E27.011, 257/E27.014, E29.089, E29.242
See application file for complete search history.

(56) References Cited

U.S. PATENT DOCUMENTS

| | | | |
|---|---|---|---|
| 5,789,815 A | 8/1998 | Tessier | |
| 6,617,695 B1 * | 9/2003 | Kasatani | ........................ 257/778 |
| 6,639,324 B1 | 10/2003 | Chien | |
| 6,673,484 B2 * | 1/2004 | Matsuura | ........................ 429/96 |

(Continued)

*Primary Examiner* — Monica D Harrison
(74) *Attorney, Agent, or Firm* — Farjami & Farjami LLP

(57) ABSTRACT

According to one exemplary embodiment, a semiconductor package includes a substrate having lower and upper surfaces. The semiconductor package further includes at least one passive component coupled to first and second conductive pads on the upper surface of the substrate. The semiconductor package further includes at least one semiconductor device coupled to a first conductive pad on the lower surface of the substrate. The at least one semiconductor device has a first electrode for electrical and mechanical connection to a conductive pad external to the semiconductor package. The at least one semiconductor device can have a second electrode electrically and mechanically coupled to the first conductive pad on the lower surface of the substrate.

20 Claims, 5 Drawing Sheets

(56) References Cited

U.S. PATENT DOCUMENTS

| | | | |
|---|---|---|---|
| 7,049,692 B2 * | 5/2006 | Nishimura et al. | 257/686 |
| 7,230,333 B2 | 6/2007 | Standing | |
| 7,271,477 B2 | 9/2007 | Saito | |
| 7,368,325 B2 | 5/2008 | Standing | |
| 7,638,818 B2 * | 12/2009 | Wu et al. | 257/192 |
| 2005/0272399 A1 * | 12/2005 | Murata | 455/333 |
| 2006/0043550 A1 | 3/2006 | Zhuang | |
| 2006/0186524 A1 * | 8/2006 | Aiba et al. | 257/686 |
| 2008/0066303 A1 | 3/2008 | Standing | |
| 2008/0230889 A1 | 9/2008 | Standing | |

* cited by examiner

SEMICONDUCTOR DEVICE AND PASSIVE COMPONENT INTEGRATION IN A SEMICONDUCTOR PACKAGE

The present application claims the benefit of and priority to a provisional patent application entitled "Advanced Packaging Concept," Ser. No. 61/131,690 filed on Jun. 11, 2008. The disclosure in that provisional application is hereby incorporated fully by reference into the present application.

The present application is also a continuation-in-part of, and claims the benefit of and priority to a pending parent patent application entitled "Semiconductor Package," Ser. No. 12/037,557 filed on Feb. 26, 2008. The disclosure in that pending parent application is also hereby incorporated fully by reference into the present application.

BACKGROUND OF THE INVENTION

Moreover, the present application is related to issued U.S. Pat. Nos. 7,230,333 and 7,368,325. The respective disclosures in these two patents is hereby incorporated fully by reference into the present application. Further, the present application is related to United States published application number 2008-0066303. The disclosure in this published application is also hereby incorporated fully by reference into the present application.

DEFINITION

In the present application, "group III-V semiconductor" refers to a compound semiconductor that includes at least one group III element and at least one group V element, such as, but not limited to, gallium nitride (GaN), gallium arsenide (GaAs), indium aluminum gallium nitride (InAlGaN), indium gallium nitride (InGaN) and the like. Analogously, "III-nitride refers to a compound semiconductor that includes nitrogen and at least one group III element such as, but not limited to, GaN, AlGaN, InN, InGaN, InAlGaN and the like."

FIELD OF THE INVENTION

The present invention is generally in the field of semiconductors. More particularly, the invention is in the field of semiconductor packages.

BACKGROUND ART

Power processing circuits, such as DC-DC converters, voltage regulators, and the like, can include one or more semiconductor devices, such as power field effect transistors (FETs), and an integrated circuit (IC) semiconductor die (also referred to simply as an "IC die" in the present application) to control the operation of the semiconductor devices. A power processing circuit, such as a DC-DC converter or voltage regulator, can also include passive components, such as capacitors, resistors, and inductors. However, since circuit board space is typically limited in electronic devices that utilize a power processing circuit, such as a DC-DC converter or voltage regulator, it is desirable to reduce the overall circuit board area consumed by the power processing circuit.

In a conventional arrangement, a power processing circuit, such as a DC-DC converter, a voltage regulator, or the like, including an IC die and one or more semiconductor devices, such as power FETs, can be mounted on an insulative substrate in a semiconductor package. The semiconductor package can, in turn, be mounted on a circuit board, such as a printed circuit board. In order to reduce the overall footprint of the power processing circuit, passive components that are necessary for proper operation of the power processing circuit can be mounted on the circuit board in close proximity to the semiconductor package. However, the conventional arrangement can still consume an undesirable amount of circuit board area.

SUMMARY OF THE INVENTION

Semiconductor device and passive component integration in a semiconductor package, substantially as shown in and/or described in connection with at least one of the figures, and as set forth more completely in the claims.

DETAILED DESCRIPTION OF THE INVENTION

The present invention is directed to semiconductor device and passive component integration in a semiconductor package. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1A:
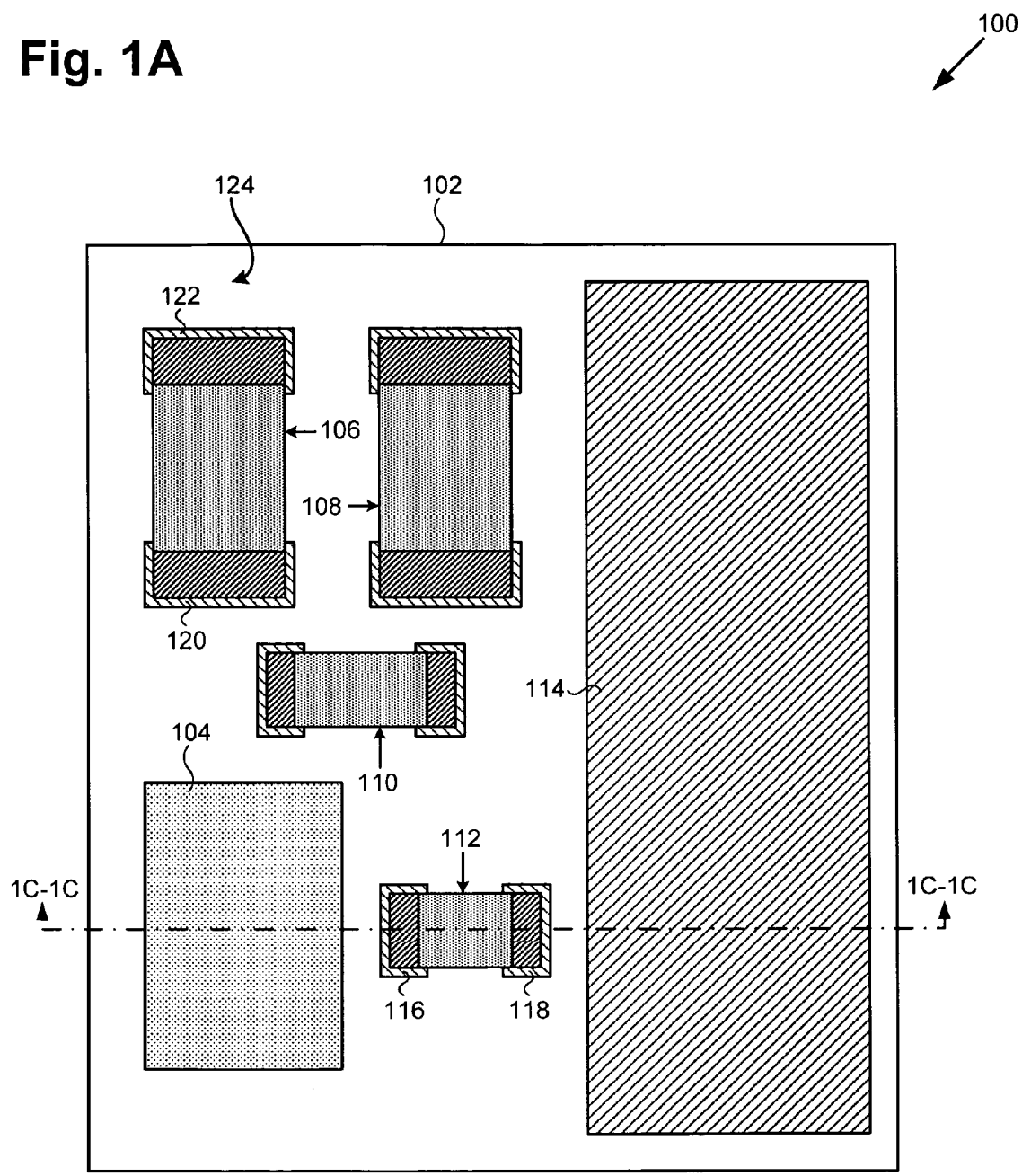
FIG. 1A illustrates a top view of an exemplary semiconductor package in accordance with one embodiment of the present invention.

FIG. 1A shows a top view of an exemplary semiconductor package in accordance with one embodiment of the present invention. Semiconductor package 100 includes substrate 102, IC die 104, passive components 106, 108, 110, and 112 (hereinafter "passive components 106 through 112"), metallic body 114, and conductive pads 116, 118, 120, and 122 (hereinafter "conductive pads 116 through 122"). Semiconductor package 100 can also include at least one semiconductor device (not shown in FIG. 1A) and additional conductive pads, which are situated on a lower surface of substrate 102. Semiconductor package 100 can also include conductive traces (not shown in FIG. 1A) on upper surface 124 of substrate 102 for providing interconnections between IC die 104 and passive components 106 through 112. Semiconductor package 100 can be, for example, a package for a power processing circuit, such as a DC-DC converter, a voltage regulator, or the like. In one embodiment, semiconductor package 100 can be a package for a power stage of a buck converter. It is noted that in FIG. 1A, only conductive pads 116 through 122 are specifically discussed herein to preserve brevity.

As shown in FIG. 1A, IC die 104, conductive pads 116 through 122, and metallic plate 114 are situated on upper surface 124 of substrate 102. IC die 104 can comprise, for example, a controller for controlling semiconductor devices, such as power FETs, situated on a lower surface of substrate 102, in an embodiment of the invention. In one embodiment, IC die 104 can provide drive signals, such pulse width modulation (PWM) drive signals, to semiconductor devices (not shown in FIG. 1A) situated on the lower surface of substrate 102 in semiconductor package 100. IC die 104 can include temperature sensing circuitry and/or short circuit detection circuitry in an embodiment of the invention. In one embodiment, IC die 104 may not be utilized. IC die 104 can include multiple input/output (I/O) electrodes (not shown in FIG. 1A), which can be electrically and mechanically connected to underlying contact pads (not shown in FIG. 1A) situated on upper surface 124 of substrate 102.

Metallic body 114, such as a metallic plate, can be provided on upper surface 124 of substrate 102 for dissipating heat generated by one or more semiconductor devices situated on the lower surface of substrate 102. To provide additional heat dissipation, a heat sink or the like can be thermally coupled to metallic body 114. In one embodiment, metallic body 114 may not be utilized. Metallic body 114 and conductive pads 116 through 122 can comprise, for example, copper, aluminum, or other metal or metal stack. Substrate 102 can be a laminate substrate and can comprise an insulating material, such as Flame Retardant 4 (FR4). In one embodiment, substrate 102 can comprise a thermally conductive material, such as aluminum oxide ($Al_2O_3$) or the like. In another embodiment, substrate 102 can comprise a ceramic material. Substrate 102 can also include multiple conductive vias, which are not shown in FIG. 1A.

Also shown in FIG. 1A, passive components 106 through 112 are situated on upper surface 124 of substrate 102 and can be electrically and mechanically coupled to conductive pads, such as conductive pads 116 through 122. Passive components 106 through 112 can be, for example, surface mount components. In one embodiment, one or more of passive components 106 through 112 may not be directly electrically and mechanically coupled to conductive pads on upper surface 124 of substrate 102. For example, passive component 112 can be electrically and mechanically connected to conductive pads 116 and 118 and passive component 106 can be electrically and mechanically connected to conductive pads 120 and 122. Passive components 106 through 112 can each be electrically and mechanically connected to a pair of conductive pads on upper surface 124 by utilizing a conductive adhesive, such as solder, a conductive epoxy, or the like.

Passive components 106 through 112 can each be, for example, a capacitor, a resistor, an inductor, a diode, or other type of passive component. In an embodiment of the invention, passive components 106 through 112 can each be a bypass capacitor, a filter capacitor, a coupling capacitor, an output capacitor, or other type of capacitor. Each of passive components 106 through 112 can be electrically coupled to conductive vias (not shown in FIG. 1A) in substrate 102 or to I/O electrodes of IC die 104 by, for example, conductive traces (not shown in FIG. 1A) situated on upper surface 124 of substrate 102. Passive components 106 through 112 can be utilized in a circuit, such as a power processing circuit, that includes IC die 104 and at least one semiconductor device (not shown in FIG. 1A) situated on the bottom surface of substrate 102. For example, passive components 106 through 112, IC die 104, and two semiconductor devices situated on the bottom surface of substrate 102 can be utilized in a DC-DC converter.

Figure 1B:
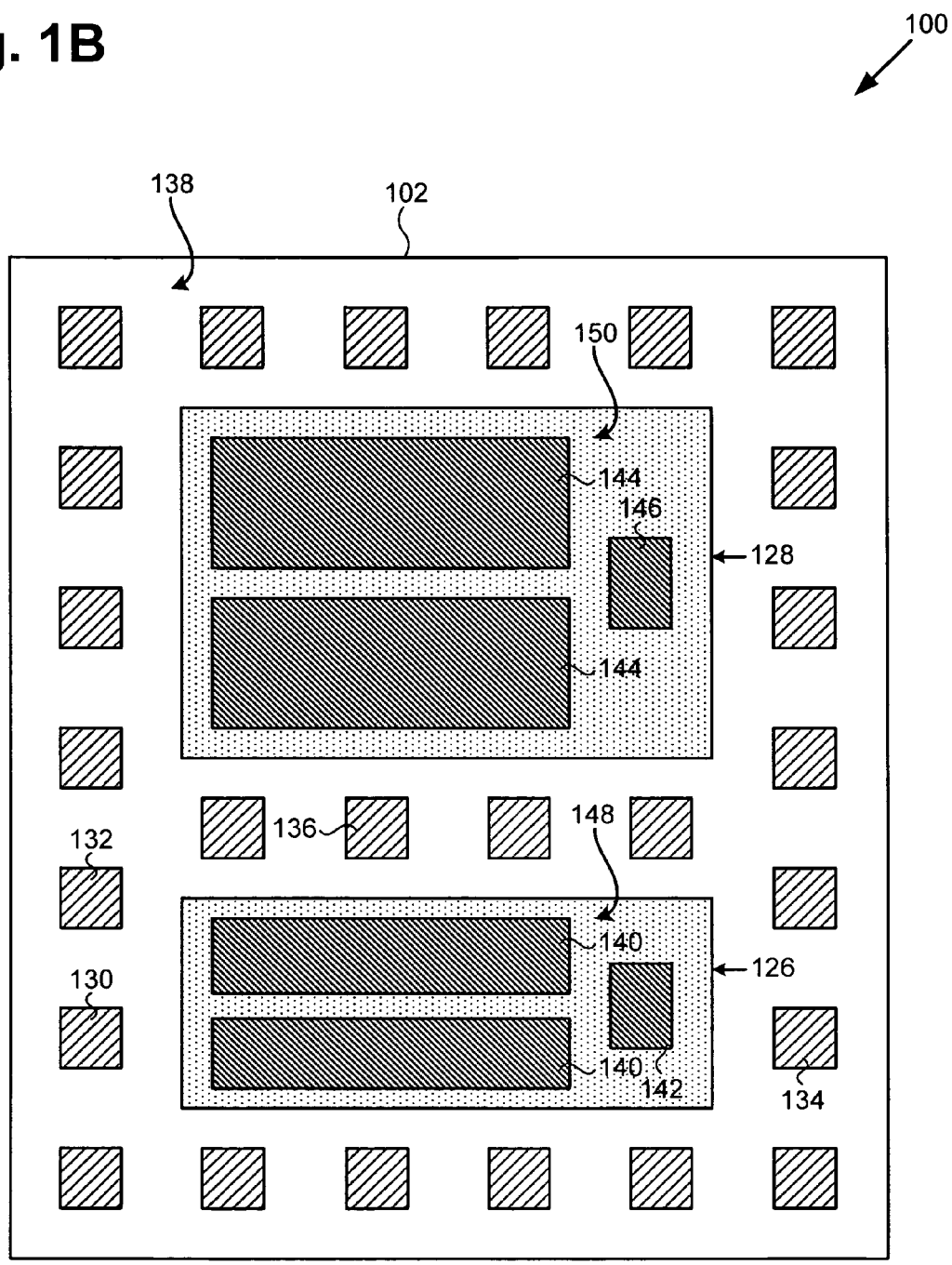
FIG. 1B illustrates a bottom view of the exemplary semiconductor package of FIG. 1A.

FIG. 1B shows a bottom view of semiconductor package 100 in FIG. 1A. In FIGS. 1A and 1B, like numerals identify like features. In addition to the features shown in FIG. 1A, semiconductor package 100 also includes semiconductor dies 126 and 128 and conductive pads 130, 132, 134, and 136 (hereinafter "conductive pads 130 through 136"), which are situated on lower surface 138 of substrate 102. Semiconductor device 126 includes source electrode 140, gate electrode 142, and a drain electrode (not shown in FIG. 1B) and semiconductor device 128 includes source electrode 144, gate electrode 146, and a drain electrode (not shown in FIG. 1B). It is noted that in FIG. 1B, only conductive pads 130 through 136 are specifically discussed herein to preserve brevity.

As shown in FIG. 1B, semiconductor devices 126 and 128 are situated on lower surface 138 of substrate 102 and can each be, for example, a power semiconductor device. For example, semiconductor devices 126 and 128 can each be a power FET, such as a power MOSFET. In one embodiment of the invention, semiconductor devices 126 and 128 can each be an isolated gate bipolar transistor (IGBT). In one embodiment, semiconductor devices 126 and 128 can each be a group III-V semiconductor device, such as a III-nitride device. In an embodiment of the invention, semiconductor devices 126 and 128 can each be a gallium nitride (GaN) device or other III-nitride device.

Also shown in FIG. 1B, source electrode 140 and gate electrode 142 of semiconductor device 126 are situated on surface 148 of semiconductor device 126 and a drain electrode (not shown in FIG. 1B) is situated on an opposite surface of semiconductor device 126. Further shown in FIG. 1B, source electrode 144 and gate electrode 146 of semiconductor device 128 are situated on surface 150 of semiconductor device 128 and a drain electrode (not shown in FIG. 1B) is situated on an opposite surface of semiconductor device 128. In an embodiment in which semiconductor devices 126 and 128 are each an IGBT having base, emitter, and collector electrodes, the base and emitter electrodes can be situated on one surface of the semiconductor device and the collector electrode can be situated on an opposite surface of the semiconductor device.

Semiconductor devices 126 and 128 can be electrically and mechanically connected to respective conductive pads (not shown in FIG. 1B) situated on lower surface 138 of substrate 102. For example, the drain electrodes (not shown in FIG. 1B) of semiconductor devices 126 and 128 can be electrically and mechanically connected to respective conductive pads on lower surface 138 of substrate 102 by using a conductive adhesive, such as solder, a conductive epoxy, or the like. Source electrode 140 and gate electrode 142 of semiconductor device 126 can be readied for connection to corresponding conductive pads on a circuit board (not shown in FIG. 1B) using a conductive adhesive such as solder, conductive epoxy, or the like. For example, source electrode 140 and gate electrode 142 can be rendered solderable so that they can be electrically and mechanically connected to respective conductive pads on a circuit board by utilizing solder.

Similarly, source electrode 144 and gate electrode 146 of semiconductor device 128 can be readied for connection to corresponding conductive pads on a circuit board utilizing a conductive adhesive such as solder, conductive epoxy, or the like. In an embodiment in which semiconductor devices 126 and 128 each comprise a GaN device, the backside of the GaN device can be readied for electrical and mechanical connection to a corresponding conductive pad on a circuit board using a conductive adhesive such as solder, conductive epoxy, or the like. In an embodiment in which semiconductor package 100 is utilized as a power stage of a buck converter, semiconductor device 126 can be utilized as a control switch while semiconductor device 128 can be utilized as a synchronous switch in the buck converter.

Also shown in FIG. 1B, conductive pads 130 through 136 are situated on lower surface 138 of substrate 102. In FIG. 1B, conductive pads, such as conductive pads 130, 132, and 134, extend along the perimeter of substrate 102. In another embodiment, conductive pads situated on lower surface 138 of substrate 102 may extend along only a portion of the perimeter of the substrate. Conductive pads 130 through 136 can comprise the same material as conductive pads 116 through 122 (shown in FIG. 1A) on upper surface 124 of substrate 102.

Figure 1C:
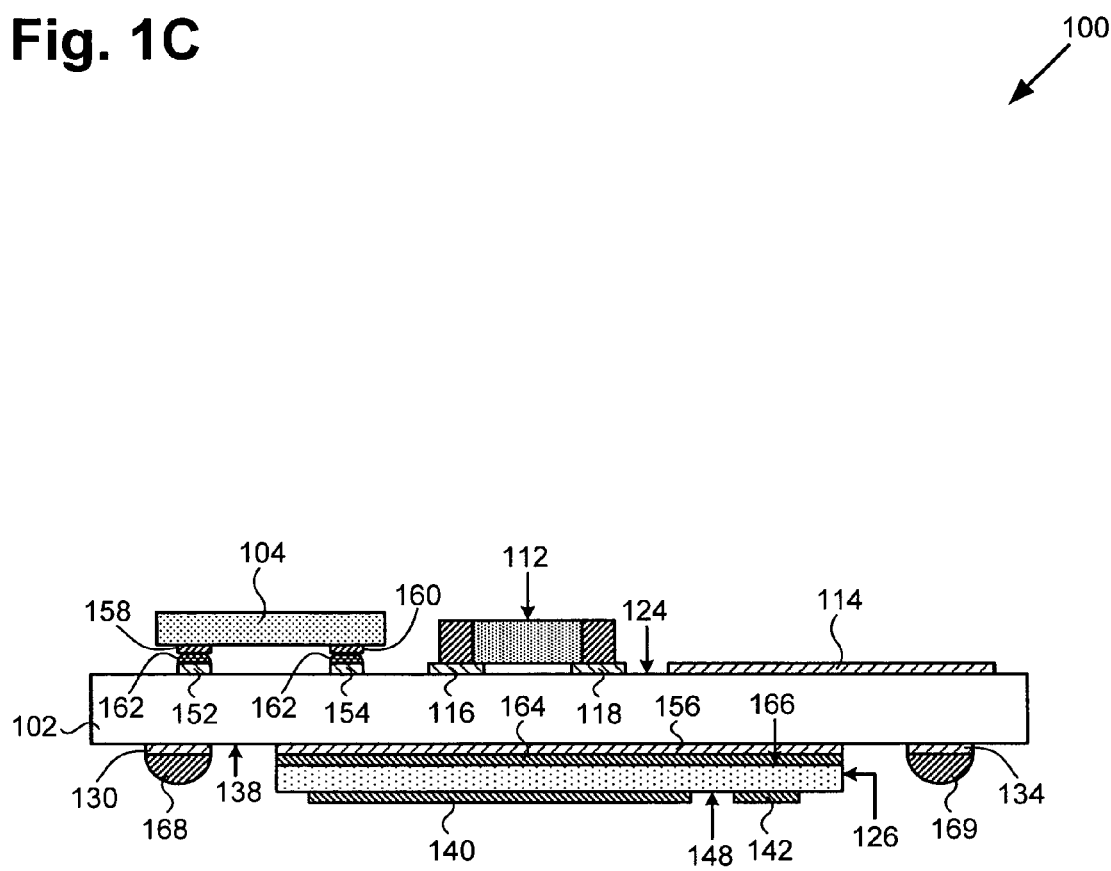
FIG. 1C illustrates a cross-sectional view of the exemplary semiconductor package of FIG. 1A.

FIG. 1C shows a cross-sectional view of semiconductor package 100 across line 2C-2C in FIG. 1A. In FIGS. 1A, 1B and 1C, like numerals identify like features. In addition to the features shown in FIGS. 1A and 1B, semiconductor package 100 further includes conductive pads 152, 154, and 156. As shown in FIG. 1C, conductive pads 152 and 154 are situated on upper surface 124 of substrate 102 and conductive pad 156 is situated on lower surface 138 of substrate 102. Conductive pads 152, 154, and 156 can comprise the same material as conductive pads 116 through 122 shown in FIG. 1A. Also shown in FIG. 1C, IC die 104 includes I/O electrodes 158 and 160, which are electrically and mechanically coupled to respective contact pads 152 and 154 by conductive adhesive 162, which can be solder, a conductive epoxy, or the like.

Conductive pads on upper surface 124 of substrate 102, such as conductive pads 152 and 154, to which I/O electrodes of IC die 104, such as I/O electrodes 158 and 160, are electrically and mechanically connected, can be electrically coupled to respective contact pads, such as contact pads 130 and 132, on lower surface 138 of substrate 102. For example, conductive vias (not shown in FIG. 1C) extending from upper surface 124 to lower surface 138 of substrate 102 can be utilized to provide a conductive path between the upper and lower surfaces of the substrate. Thus, each I/O electrode of IC die 104 can be electrically coupled from a conductive pad on upper surface 124 of substrate 102 to a conductive pad on lower surface 138 of substrate 102 by a conductive via extending through substrate 102. More specifically, conductive traces or the like on lower surface 138 of substrate 102 can be utilized to provide an electrical connection between conductive vias (not shown in FIG. 1C) in substrate 102 and conductive pads on lower surface 138 of substrate 102.

Conductive pads, such as conductive pads 130 through 136, on lower surface 138 of substrate 102 can be utilized to provide external connectivity to I/O electrodes, such as I/O electrodes 158 and 160, on IC die 104. For example, a conductive pad on lower surface 138 can be utilized to supply power to IC die 104 and another conductive pad on lower surface 138 can be utilized to provide a ground connection to IC die 104. For example, a control signal from IC die 104 can be routed to gate electrode 142 of semiconductor device 126 by utilizing a conductive pad on lower surface 138 of substrate 102 and conductive pads and traces in an external circuit board (not shown in FIG. 1C).

Further shown in FIG. 1C, drain electrode 164 of semiconductor device 126 is situated on surface 166 of semiconductor device 126 and also situated on conductive pad 156, which is situated on lower surface 138 of substrate 102. Drain electrode 164 can be electrically and mechanically connected to conductive pad 156 by utilizing a conductive adhesive, such as solder, a conductive epoxy, or the like. Although not shown in FIG. 1C, the drain electrode of semiconductor device 128 can be electrically and mechanically coupled to a conductive pad similar to conductive pad 156 on lower surface 138 of substrate 102.

Also shown in FIG. 1C, passive component 112 is situated on conductive pads 116 and 118 on top surface 124 of substrate 102. Passive component 112 can be electrically and mechanically coupled to conductive pads 116 and 118 by utilizing a conductive adhesive, such as solder, a conductive epoxy, or the like. Passive components, such as passive component 112, can be integrated with IC die 104 and semiconductor devices, such as semiconductor device 126, in semiconductor package 100 to provide an integrated circuit, such as a power converter, a voltage regulator, or other power processing circuit. Further shown in FIG. 1C, solder balls 168 and 169 are situated on respective conductive pads 130 and 134. Solder balls, such as solder balls 168 and 169, can be formed on conductive pads, such as conductive pads 130 and 134, situated on lower surface 138 of substrate 102 to enable the conductive pads to be electrically and mechanically coupled to corresponding conductive pads on a circuit board (not shown in FIG. 1C) or the like. In one embodiment, a conductive epoxy or the like can be utilized in place of solder balls 168 and 169.

By integrating passive components, such as passive component 112 and passive components 106, 108, and 110 (shown in FIG. 1A), with semiconductor devices, such as semiconductor device 126, and IC die 104 on substrate 102, short conductive traces can be provided to interconnect the passive components with the semiconductor devices and the IC die. As a result, parasitics, such as control loop parasitics, can be advantageously reduced in a power processing circuit, such as a DC-DC converter or the like. Also, passive components, such as decoupling capacitors, can be placed close to a voltage input node of a power processing circuit, such as a DC-DC converter, thereby advantageously improving transient response and reducing loss.

Figure 1D:
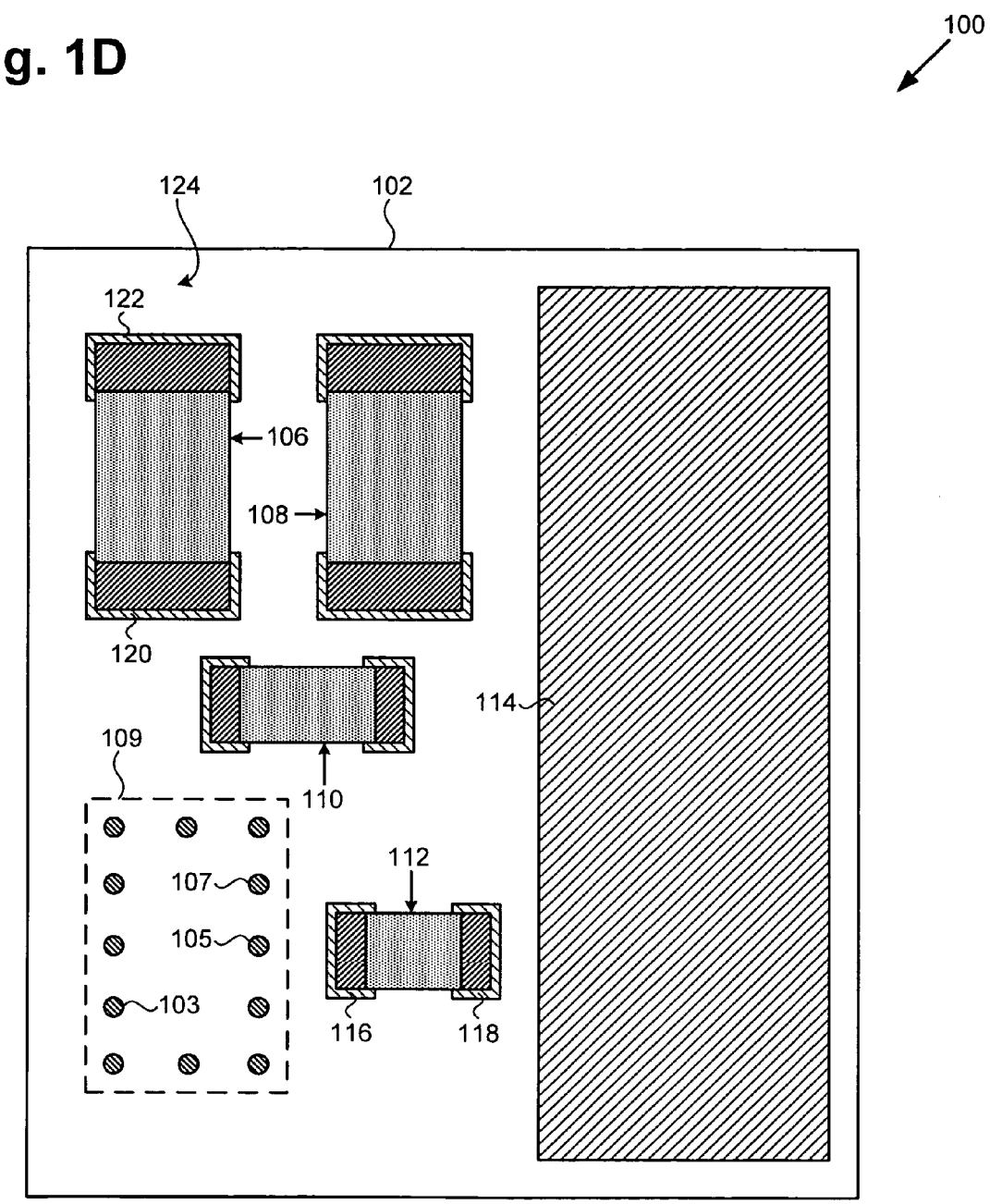
FIG. 1D illustrates a top view of the exemplary semiconductor package of FIG. 1A with an IC die removed to show underlying conductive vias.

FIG. 1D shows a top view of semiconductor package 100 with IC die 104 and underlying conductive pads removed to show exemplary conductive vias. FIG. 1D corresponds to FIG. 1A with IC die 104 removed. In FIG. 1D, conductive pads underlying IC die 104, such as conductive pads 252 and 254 (shown in FIG. 1C), have also been removed to show conductive vias, such as conductive vias 103, 105, and 107. Thus, in addition to the features shown in FIGS. 1A, 1B, and 1C, semiconductor package 100 further includes conductive vias, such as conductive vias 103, 105, and 107. It is noted that in FIG. 1D, only conductive vias 103, 105, and 107 are specifically discussed herein to preserve brevity.

As shown in FIG. 1D, conductive vias 103, 105, and 107 are situated in a region of substrate 102 underlying IC die 104 (shown in FIGS. 1A and 1C), which is indicated by dashed line 109. Conductive vias 103, 105, and 107 can be formed, for example, by etching forming via openings that extend through substrate 102 and filling the via openings with a conductive material, such as tungsten or other metal or metal stack. Conductive vias, such as conductive vias 103, 105, and 107, can also serve as thermal vias for dissipating heat generated by IC die 104 and semiconductor devices, such as semiconductor device 126. Conductive vias 103, 105, and 107 can be each be coupled by a conductive pad, such as conductive pad 152 or 154 (shown in FIG. 1C), to an I/O electrode, such as I/O electrode 158 or 160 (shown in FIG. 1C) on IC die 104. Conductive vias, such as conductive vias 103, 105, and 107 can be electrically connected to conductive pads on lower surface 138 of substrate 102, such as conductive pads 130 through 136 (shown in FIG. 1B).

Thus, conductive vias, such as conductive vias 103, 105, and 107 can provide electrically connectivity between I/O electrodes on IC die 104 and conductive pads on lower surface 138 of substrate 102. Also, other conductive vias (not shown in FIG. 1D) can be formed in substrate 102 to provide electrically connectivity between passive devices, such as passive devices 106 through 112, and semiconductor device, such as semiconductor devices 126 and 128 (shown in FIG. 1B), situated on lower surface 138 of substrate 102.

Figure 2:
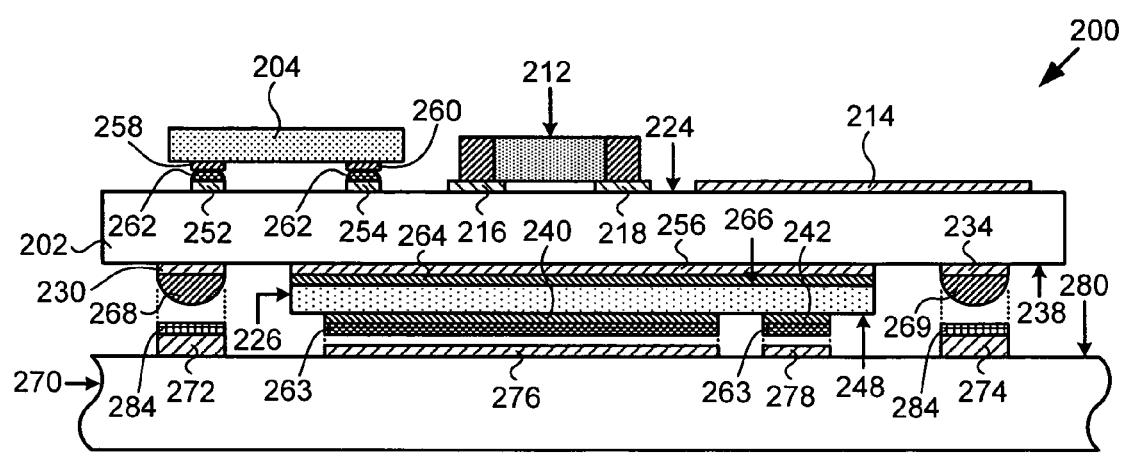
FIG. 2 illustrates a cross-sectional view of the exemplary semiconductor package of FIG. 1A and an exemplary circuit board on which to mount the exemplary semiconductor package in accordance with one embodiment of the present invention.

FIG. 2 shows a cross-sectional view of an exemplary semiconductor package readied for mounting on an exemplary circuit board in accordance with one embodiment of the present invention. In FIG. 2, semiconductor package 200 corresponds to semiconductor package 100 in FIGS. 1A through 1D. In particular, the cross-sectional view of semiconductor package 200 corresponds to the cross-sectional view of semiconductor package 100 in FIG. 1C. Thus, in FIG. 2, substrate 202, IC die 204, passive component 212, metallic body 214, conductive pads 216, 218, 230, 234, 252, 254, and 256, upper surface 224, lower surface 238, source electrode 240, gate electrode 242, surfaces 248 and 266, conductive adhesive 262, and solder balls 268 and 269 correspond, respectively, to substrate 102, IC die 104, passive component 112, metallic body 114, conductive pads 116, 118, 130, 134, 152, 154, and 156, upper surface 124, lower surface 138, source electrode 140, gate electrode 142, surfaces 148 and 166, conductive adhesive 162, and solder balls 168 and 169 in FIG. 1C.

In FIG. 2, circuit board 270, which can be a printed circuit board, includes conductive pads 272, 274, 276, and 278, which are situated on upper surface 280 of circuit board 270. Conductive pad 276 can be a conductive source pad for receiving source electrode 240 of semiconductor device 226 and conductive pad 278 can be a conductive gate pad for receiving gate electrode 242 of semiconductor device 226.

As shown in FIG. 2, mounting semiconductor package 200 onto circuit board 270 can include electrically and mechanically coupling conductive pads 230 and 234 on lower surface 238 of substrate 202 to corresponding conductive pads 272 and 274 on upper surface 280 of circuit board 270 by using respective solder balls 268 and 270 on conductive pads 230 and 234 and solder paste 284, which can be applied to conductive pads 272 and 274 of circuit board 270. Mounting semiconductor package 200 onto circuit board 270 can further include electrically and mechanically coupling source electrode 240 and gate electrode 242 of semiconductor device 226 to respective conductive pads 276 and 278 of circuit board 270 by using conductive adhesive 263, which is situated on source electrode 240 and gate electrode 242. Conductive adhesive 263 can comprise solder, a conductive epoxy, or the like. Conductive adhesive 263 can also be applied to conductive pads 276 and 278 of circuit board 270 prior to mounting semiconductor package 100 onto circuit board 270.

Circuit board 270 can also include conductive traces (not shown in FIG. 2) to provide electrically connectivity between conductive pads 272, 274, 276, and 278 on upper surface 280 of circuit board 270. Thus, for example, a control signal from IC die 204 can be routed from a conductive pad, such as conductive pad 230, on lower surface 238 of substrate 202 to gate electrode 242 of semiconductor device 226 through conductive pads and a conductive trace on circuit board 270.

Thus, as discussed above, an embodiment of the invention provides a semiconductor package wherein passive components, an IC die, and at least one semiconductor device (for example, two or more semiconductor devices) can be integrated on a substrate. In contrast, in a conventional arrangement, passive components can be situated adjacent to a semiconductor package on a circuit board. By integrating passive components with an IC die and semiconductor devices in a semiconductor package, an embodiment of the invention advantageously provides a semiconductor package that can consume less area on a circuit board compared to the conventional arrangement, wherein the passive components are situated adjacent to the semiconductor package. Also, by integrating passive components on a substrate with an IC die and semiconductor devices, an embodiment of the invention can advantageously provide reduced parasitics as a result of the proximity of the passive components to the IC die and semiconductor devices.

Additionally, an embodiment of the invention provides a semiconductor package including a metallic body situated on an upper surface of a substrate and at least one semiconductor device (for example, two or more semiconductor devices) electrically and mechanically coupled to respective conductive pads on a lower surface of the substrate. As a result, an embodiment of the invention can utilize the metallic body on the upper surface of the substrate to provide dissipation of heat generated by the at least one semiconductor device mounted on conductive pads on the lower surface of the substrate. Furthermore, additional heat dissipation can be provided by attaching a heat sink to the metallic body.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A semiconductor package comprising:
    a substrate having lower and upper surfaces;
    at least one passive component coupled to first and second conductive pads and situated on said upper surface of said substrate;
    at least one semiconductor device being directly coupled to said lower surface of said substrate through a third conductive pad, and electrically coupled to said at least one passive component;
    said at least one semiconductor device having a first electrode for electrical and mechanical connection to a conductive pad external to and not disposed on said semiconductor package.

2. The semiconductor package of claim 1, wherein said at least one semiconductor device has a second electrode electrically and mechanically coupled to said first conductive pad on said lower surface of said substrate.

3. The semiconductor package of claim 2, wherein said at least one semiconductor device has a third electrode adjacent to said first electrode for electrical and mechanical connection to a conductive pad external to said semiconductor package.

4. The semiconductor package of claim 2, wherein said first and second electrodes of said at least one semiconductor device are situated on opposing surfaces of said at least one semiconductor device.

5. The semiconductor package of claim 2, wherein said at least one semiconductor device is a FET, wherein said first electrode is a source electrode of said FET and said second electrode is a drain electrode of said FET.

6. The semiconductor package of claim 1 further comprising an integrated circuit (IC) die situated on said upper surface of said substrate and having a plurality of input/output electrodes.

7. The semiconductor package of claim 6, wherein each of said input/output electrodes is electrically and mechanically coupled to one of a plurality of conductive pads on said upper surface of said substrate.

8. The semiconductor package of claim 6 further comprising a second conductive pad on said lower surface of said substrate, wherein said second conductive pad on said lower surface of said substrate is coupled to one of said plurality of input/output electrodes of said IC die.

9. The semiconductor package of claim 1, wherein said at least one passive component is electrically and mechanically coupled to each of said first and second conductive pads by a conductive adhesive.

10. The semiconductor package of claim 1, wherein said at least one semiconductor device is a GaN device.

11. A semiconductor package comprising:
a substrate having lower and upper surfaces;
at least one passive component situated on said upper surface of said substrate;
at least one power transistor being directly connect to said lower surface of said substrate through a first conductive pad;
said at least one passive component being electrically connected to said power transistor in said semiconductor package so as to form at least a portion of a power processing circuit.

12. The semiconductor package of claim 11, wherein said at least one power transistor has a first electrode for electrical and mechanical connection to a second conductive pad external to and not disposed on said semiconductor package.

13. The semiconductor package of claim 11, wherein said at least one power transistor has a second electrode electrically and mechanically coupled to said first conductive pad on said lower surface of said substrate.

14. The semiconductor package of claim 11 further comprising an integrated circuit (IC) die situated on said upper surface of said substrate.

15. The semiconductor package of claim 11 further comprising an integrated circuit (IC) die situated on said upper surface of said substrate and electrically connected to said power transistor.

16. The semiconductor package of claim 15, wherein said IC die comprises a controller for controlling said power transistor.

17. The semiconductor package of claim 11, wherein said power processing circuit is a DC-DC converter.

18. The semiconductor package of claim 11, wherein said at least one passive component comprises a bypass capacitor.

19. The semiconductor package of claim 11, wherein said at least one passive component comprises an output capacitor.

20. The semiconductor package of claim 11, wherein said at least one power transistor is a GaN device.

* * * * *